(12) United States Patent
Liu et al.

(10) Patent No.: US 12,119,382 B2
(45) Date of Patent: Oct. 15, 2024

(54) BUFFER LAYER STRUCTURE TO IMPROVE GAN SEMICONDUCTORS

(71) Applicant: GlobalWafers Co., Ltd., Hsinchu (TW)

(72) Inventors: Jia-Zhe Liu, Hsinchu (TW); Yen Lun Huang, Hsinchu (TW); Chih-Yuan Chuang, Hsinchu (TW); Che Ming Liu, Hsinchu (TW); Wen-Ching Hsu, Hsinchu (TW); Manhsuan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 18/181,272

(22) Filed: Mar. 9, 2023

(65) Prior Publication Data
US 2023/0215924 A1 Jul. 6, 2023

Related U.S. Application Data

(62) Division of application No. 16/226,265, filed on Dec. 19, 2018, now Pat. No. 11,705,489.

(60) Provisional application No. 62/617,484, filed on Jan. 15, 2018.

(51) Int. Cl.
*H01L 29/205* (2006.01)
*H01L 21/02* (2006.01)
*H01L 29/20* (2006.01)

(52) U.S. Cl.
CPC ...... *H01L 29/205* (2013.01); *H01L 21/02458* (2013.01); *H01L 21/02505* (2013.01); *H01L 29/2003* (2013.01); *H01L 21/02507* (2013.01); *H01L 21/0251* (2013.01); *H01L 21/02538* (2013.01); *H01L 21/0262* (2013.01)

(58) Field of Classification Search
CPC ............... H01L 29/205; H01L 29/2003; H01L 21/02458; H01L 21/0251
See application file for complete search history.

(56) References Cited

U.S. PATENT DOCUMENTS

2010/0244096 A1* 9/2010 Sato .................. H01L 21/02505
257/190

* cited by examiner

*Primary Examiner* — Vincent Wall
(74) *Attorney, Agent, or Firm* — Osha Bergman Watanabe & Burton LLP

(57) ABSTRACT

A heterostructure, includes: a substrate; and a buffer layer that includes a plurality of layers having a composition $Al_xIn_yGa_{1-x-y}N$, where $x \leq 1$ and $y \geq 0$; wherein the buffer layer has a first region that includes at least two layers, a second region that includes at least two layers, and a third region that includes at least two layers.

14 Claims, 12 Drawing Sheets

BUFFER LAYER STRUCTURE TO IMPROVE GAN SEMICONDUCTORS

CROSS-REFERENCE TO RELATED APPLICATIONS

This application claims priority to U.S. patent application Ser. No. 62/617,484, filed on Jan. 15, 2018, and is a Divisional Application of U.S. application Ser. No. 16/226,265, filed on Dec. 19, 2018, which are herein incorporated by reference in their entireties.

BACKGROUND

Nitride semiconductors are used in the creation of new solid-state lighting, highly efficient amplifiers for wireless communications, advanced power electronics with unprecedentedly low losses, and a large array of new high-performance devices, for example.

Group III-V semiconductors, such as gallium nitride (GaN) or other III-Nitride materials (e.g., semiconductor compounds that include nitrogen and at least one element from group III of the Periodic Table of the Elements), are used in many microelectronic implementations in which high power density and high efficiency switching are required. Examples of such implementations include field-effect transistors (FETs) and high electron mobility transistors (HEMTs).

SUMMARY OF THE INVENTION

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a heterostructure that includes a substrate; and a buffer layer comprising a plurality of layers having a composition $Al_xIn_yGa_{1-x-y}N$, where $x \leq 1$ and $y \geq 0$; wherein the buffer layer has a first region, comprising at least two layers, one having a first layer profile and another having a second layer profile, wherein the first layer profile has a higher aluminum content than the second layer profile; wherein the buffer layer has a second region comprising at least two layers, one having a third layer profile and another having a fourth layer profile, wherein the third layer profile has a higher aluminum content than the fourth layer profile and the fourth layer profile has a lower aluminum content than the second layer profile of the first region; and wherein the buffer layer has a third region comprising at least two layers, one having a fifth layer profile and another having a sixth layer profile, wherein the fifth layer profile has a higher aluminum content than the sixth layer profile and the sixth layer profile has a lower aluminum content than the fourth layer profile of the second region.

In another aspect, embodiments disclosed herein relate to a heterostructure that includes a substrate; and a buffer layer having a composition $Al_xIn_yGa_{1-x-y}N$, where $x \leq 1$ and $y \geq 0$; wherein the content of aluminum continuously varies throughout the thickness of the buffer layer and includes at least one layer of continuously increasing aluminum concentration and at least one layer of continuously decreasing aluminum concentration, along the growth direction of the buffer layer.

In yet another aspect, embodiments disclosed herein relate to a method for fabricating a heterostructure that includes depositing a buffer layer comprising a plurality of layers having a composition $Al_xIn_yGa_{1-x-y}N$, where $x \leq 1$ and $y \geq 0$ on a substrate; wherein the buffer layer has a first region, comprising at least two layers, one having a first layer profile and another having a second layer profile, wherein the first layer profile has a higher aluminum content than the second layer profile; wherein the buffer layer has a second region comprising at least two layers, one having a third layer profile and another having a fourth layer profile, wherein the third layer profile has a higher aluminum content than the fourth layer profile and the fourth layer profile has a lower aluminum content than the second layer profile of the first region; and wherein the buffer layer has a third region comprising at least two layers, one having a fifth layer profile and another having a sixth layer profile, wherein the fifth layer profile has a higher aluminum content than the sixth layer profile and the sixth layer profile has a lower aluminum content than the fourth layer profile of the second region.

In yet another aspect, embodiments disclosed herein relate to a method for fabricating a heterostructure that includes depositing a buffer layer having a composition $Al_xIn_yGa_{1-x-y}N$, where $x \leq 1$ and $y \geq 0$; wherein the content of aluminum continuously varies throughout the thickness of the buffer layer and includes at least one layer of continuously increasing aluminum concentration and at least one layer of continuously decreasing aluminum concentration, along the growth direction of the buffer layer.

Other aspects and advantages of the claimed subject matter will be apparent from the following description and the appended claims.

DETAILED DESCRIPTION

Embodiments disclosed herein relate generally to semiconductor heterostructure compositions and methods of making said heterostructure compositions. More specifically, embodiments disclosed herein relate generally to semiconductor heterostructures that include a substrate and a buffer layer comprising a plurality of layers having a composition $Al_xIn_yGa_{1-x-y}N$, where $x \leq 1$ and $y \geq 0$, wherein the content of aluminum changes throughout the plurality of layers. Further details and embodiments discussing the variation in the content of aluminum changes will be discussed in detail below.

Group III-V semiconductors include III-Nitride materials formed of gallium nitride (GaN) and/or its alloys, such as aluminum gallium nitride (AlGaN), indium gallium nitride (InGaN), and aluminum indium gallium nitride (AlInGaN). These materials are semiconductor compounds that have a relatively wide, direct bandgap and strong piezoelectric polarizations, and can enable high breakdown fields and the creation of two-dimensional electron gases (2DEGs). As a result, III-Nitride materials, particularly GaN, are used in many microelectronic implementations in which high power density and high efficiency switching are required. Examples of such implementations include field-effect transistors (FETs), high electron mobility transistors (HEMTs), and diodes.

Figure 1:
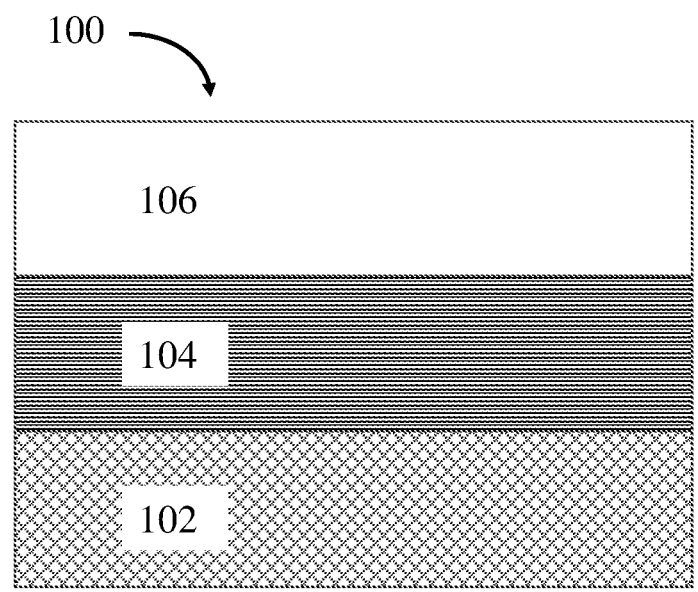
FIG. 1 depicts an embodiment of a semiconductor heterostructure according to the present disclosure.

However, direct epitaxial growth of a group III-V semiconductor on a substrate, such as silicon, can suffer from significant lattice spacing mismatch between the two layers of materials. This lattice spacing mismatch creates a highly stressed interface after cooling the materials and a stressed interface can lead to delamination of the layers, cracking, or other damage to the heterostructure. The inclusion of a buffer layer between the substrate and the group III-V semiconductor layer is one strategy used for minimizing the stress. Commonly used buffer layer materials include group III-V semiconductors (e.g., GaN, AN, and AlGaN, all of which may be doped with boron and/or indium) that are compositionally distinct from the working group III-V semiconductor layer. FIG. 1 shows a depiction of a semiconductor heterostructure 100 that includes a substrate 102, a buffer layer 104, and a working group III-V semiconductor layer 106. In one or more embodiments, the substrate of the heterostructure may be formed from one of silicon (Si), silicon carbide (SiC), gallium nitride (GaN), or sapphire ($Al_2O_3$). In one or more embodiments, the substrate may have a nucleation layer deposited onto its surface prior to depositing a buffer layer according to the present disclosure (i.e., a distinct layer in between 102 and 104 of FIG. 1). In one or more embodiments, the composition of the nucleation layer may be $Al_xIn_yGa_{1-x-y}N$, where $x \leq 1$ and $y \geq 0$, where the nucleation layer has a distinct composition from the buffer layer.

In one or more embodiments, according to the present disclosure semiconductor heterostructures include a substrate and a buffer layer, wherein the buffer layer is composed of a plurality of layers having a composition $Al_xIn_yGa_{1-x-y}N$, where $x \leq 1$ and $y \geq 0$, wherein the content of aluminum changes throughout the buffer layer and in some embodiments throughout one or more layers making up the buffer layer. In one or more embodiments, the buffer layer may have a graded structure and/or a superlattice structure. More specifically, a graded structure refers to a buffer layer that includes at least one layer that has a concentration variation throughout the structure (e.g., the value of X in $Al_xGa_{1-x}N$ varies continuously throughout the layer), while a superlattice structure is a laminated structure that comprises at least two compositionally different layers repeated more than once in a consistent and repetitive manner throughout the structure.

For a simple example, a first layer of a buffer layer may be deposited on the substrate and the first layer may have an aluminum content that is higher than a second layer of the buffer layer that is deposited onto the first layer. There may be many such layers deposited sequentially to create the final buffer layer structure that a working group III-V semiconductor layer may be eventually deposited on and the aluminum content can vary in a multitude of different ways throughout the layers making up the buffer layer. The term "aluminum content" is meant to represents the value for "x" in the buffer layer formula of $Al_xIn_yGa_{1-x-y}N$, where $x \leq 1$ and $y \geq 0$. A particular layer may have a fixed aluminum content (i.e., "x" is fixed) or it may have an aluminum content that varies continuously throughout the layer (i.e., "x" changes continuously as the layer is deposited). In general, a "layer profile" may be defined as a particular layer's aluminum content and it variation within the layer. There may be multiple distinct layers within a buffer layer that have the same layer profile and two distinct layer profiles may be repeated in a sequential fashion within a buffer layer according to the present disclosure. In the description below, an attempt will be made to describe a variety of embodiments of layering that are envisioned to create buffer layer structures according to the present disclosure. However, the present disclosure is not intended to be limited to only those embodiments described and may also include other layer combinations of $Al_xIn_yGa_{1-x-y}N$ having fixed aluminum content, variable aluminum content, or a combination of both fixed and variable aluminum content. In these embodiments, a "growth direction" may be mentioned and this term is intended to mean the direction perpendicular to the upper surface of the substrate that the layers constituting the buffer layer are sequentially deposited in. Further, a particular layer's thickness may be a measure of the dimension of the layer in the growth direction. In one or more embodiments the thickness of each particular layer may independently be between about 1 nm and 50 nm, or between about 2 nm and 30 nm, or between about 5 nm and 15 nm. In one or more embodiments, a particular layer with higher aluminum concentration percentage may be thinner than a particular layer with lower aluminum centration percentage. Conversely, in one or more embodiments, a particular layer with lower aluminum concentration percentage may be thicker than a particular layer with higher aluminum concentration percentage. In one or more embodiments a buffer layer, composed of many individual layers, may have a total thickness that is not particularly limited but, in some instances, the total thickness may be between about 100 nm and 1000 nm or between about 200 nm and 500 nm. In one or more embodiments, the buffer layer may have the total thickness greater than 1000 nm.

Figure 2:
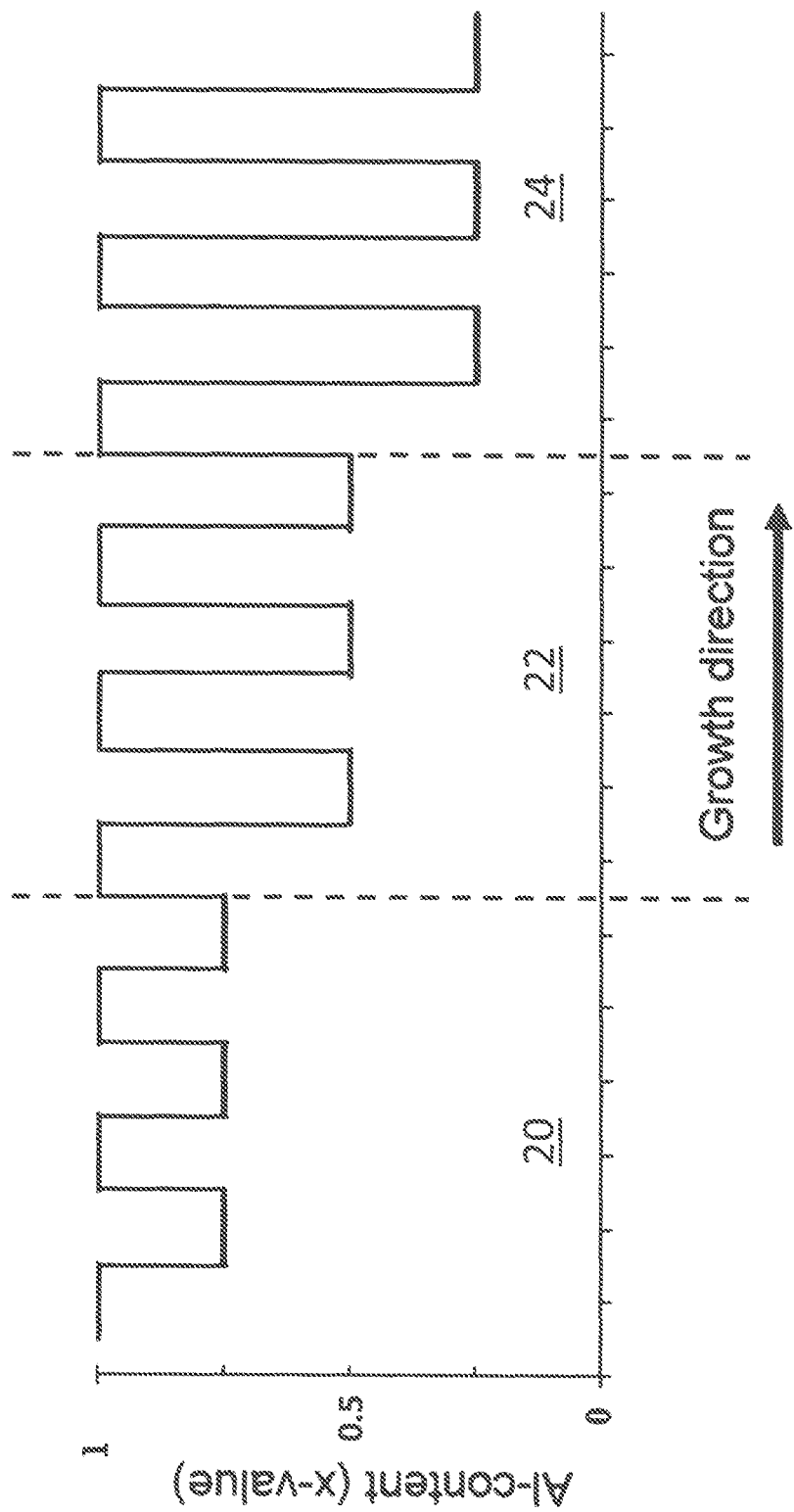
FIG. 2 depicts an embodiment of the composition of a buffer layer according to the present disclosure.

FIG. 2 depicts an embodiment of the composition of a buffer layer according to the present disclosure. As depicted, the aluminum content in a buffer layer having a formula of $Al_xIn_yGa_{1-x-y}N$, where $x \leq 1$ and $y \geq 0$, may be varied throughout the thickness of the buffer layer so that the buffer layer has a first region 20, comprising at least two layers, one having a first layer profile and another having a second layer profile, wherein the first layer profile has a higher aluminum content than the second layer profile; wherein the buffer layer has a second region 22 comprising at least two layers, one having a third layer profile and another with a fourth layer profile, wherein the third layer profile has a higher aluminum content than the fourth layer profile and the fourth layer profile has a lower aluminum content than the second layer profile of the first region; and wherein the buffer layer has a third region 24 comprising at least two layers, one having a fifth layer profile and another with a sixth layer profile, wherein the fifth layer profile has a higher aluminum content than the sixth layer profile and the sixth layer profile has a lower aluminum content than the fourth layer profile of the second region.

The aluminum content is shown as the y-axis in FIG. 2 and represents the value for "x" in the buffer layer formula of $Al_xIn_yGa_{1-x-y}N$, where x≤1 and y≥0. Further, in FIG. 2 each of the layers have a constant aluminum content throughout their thickness (i.e., the values of the aluminum content in each layer are parallel to the x-axis). FIG. 2 depicts the buffer layer in the first region 20 repeating the first layer profile and the second layer profile three times however, in one or more embodiments, a buffer layer may repeat the first layer profile and second layer profile in the first region 20 at least 5 times or at least 10 times and up to 20 times. Similarly, the buffer layer in the second region 22 is shown in FIG. 2 repeating the third layer profile and the fourth layer profile three times however, in one or more embodiments, a buffer layer may repeat the third layer profile and fourth layer profile in the second region 22 at least 5 times or at least 10 times and up to 20 times. Finally, the buffer layer in the third region 24 is shown in FIG. 2 repeating the fifth layer profile and the sixth layer profile three times however, in one or more embodiments, a buffer layer may repeat the fifth layer profile and sixth layer profile in the third region 24 at least 5 times or at least 10 times and up to 20 times.

In embodiments that have a buffer layer using a similar layer profile as what is depicted in FIG. 2 the aluminum content for the first layer profile, third layer profile, and fifth layer profile may be between 0.91 and 1, for the second layer profile it may be between 0.51 and 0.9, for the fourth layer profile it may be between 0.26 and 0.5, and for the sixth layer profile it may be between 0.01 and 0.25. In one or more embodiments of the present disclosure, the terminal layer of the buffer layer (i.e., the last layer deposited prior to depositing the working group III-V semiconductor layer) may have an aluminum content equal to or less than 0.5, or equal to or less than 0.35, or equal to or less than 0.25.

Figure 3:
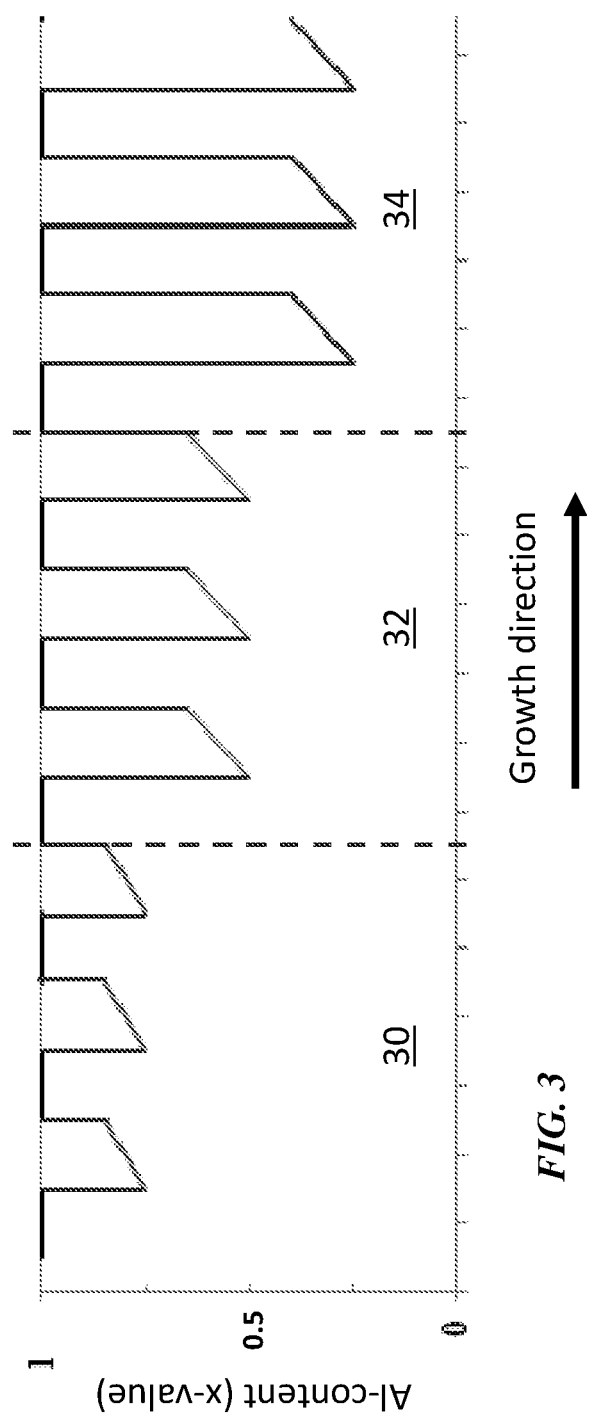
FIG. 3 depicts an embodiment of the composition of a buffer layer according to the present disclosure.

FIG. 3 depicts an embodiment of the composition of a buffer layer according to the present disclosure. As depicted, the aluminum content in a buffer layer having a formula of $Al_xIn_yGa_{1-x-y}N$, where x≤1 and y≥0, may be varied throughout the thickness of the buffer layer so that the buffer layer has a first region 30, comprising at least two layers, one having a first layer profile and another having a second layer profile, wherein the first layer profile has a higher aluminum content than the second layer profile; wherein the buffer layer has a second region 32 comprising at least two layers, one having a third layer profile and another with a fourth layer profile, wherein the third layer profile has a higher aluminum content than the fourth layer profile and the fourth layer profile has a lower aluminum content than the second layer profile of the first region; and wherein the buffer layer has a third region 34 comprising at least two layers, one having a fifth layer profile and another with a sixth layer profile, wherein the fifth layer profile has a higher aluminum content than the sixth layer profile and the sixth layer profile has a lower aluminum content than the fourth layer profile of the second region.

The aluminum content is shown as the y-axis in FIG. 3 and represents the value for "x" in the buffer layer formula of $Al_xIn_yGa_{1-x-y}N$, where x≤1 and y≥0. Further, in FIG. 3 each of the layers with an odd numbered layer profile have a constant aluminum content throughout their thickness (i.e., the values of the aluminum content in each layer are parallel to the x-axis), while each of the layers with an even numbered layer profile have a variable aluminum content that continuously increases throughout their thickness in the growth direction. FIG. 3 depicts the buffer layer in the first region 30 repeating the first layer profile and the second layer profile three times however, in one or more embodiments, a buffer layer may repeat the first layer profile and second layer profile in the first region 30 at least 5 times or at least 10 times and up to 20 times. Similarly, the buffer layer in the second region 32 is shown in FIG. 3 repeating the third layer profile and the fourth layer profile three times however, in one or more embodiments, a buffer layer may repeat the third layer profile and fourth layer profile in the second region 32 at least 5 times or at least 10 times and up to 20 times. Finally, the buffer layer in the third region 34 is shown in FIG. 3 repeating the fifth layer profile and the sixth layer profile three times however, in one or more embodiments, a buffer layer may repeat the fifth layer profile and sixth layer profile in the third region 34 at least 5 times or at least 10 times and up to 20 times.

In embodiments that have a buffer layer using a similar layer profile as what is depicted in FIG. 3 the aluminum content for the first layer profile, third layer profile, and fifth layer profile may be between 0.91 and 1, for the second layer profile it may vary between 0.7 and 0.9, for the fourth layer profile it may vary between 0.5 and 0.69, and for the sixth layer profile it may be between 0.01 and 0.49. In one or more embodiments of the present disclosure, the terminal layer of the buffer layer (i.e., the last layer deposited prior to depositing the working group III-V semiconductor layer) may have at least a portion of the layer with an aluminum content equal to or less than 0.5, or equal to or less than 0.35, or equal to or less than 0.25.

Figure 4:
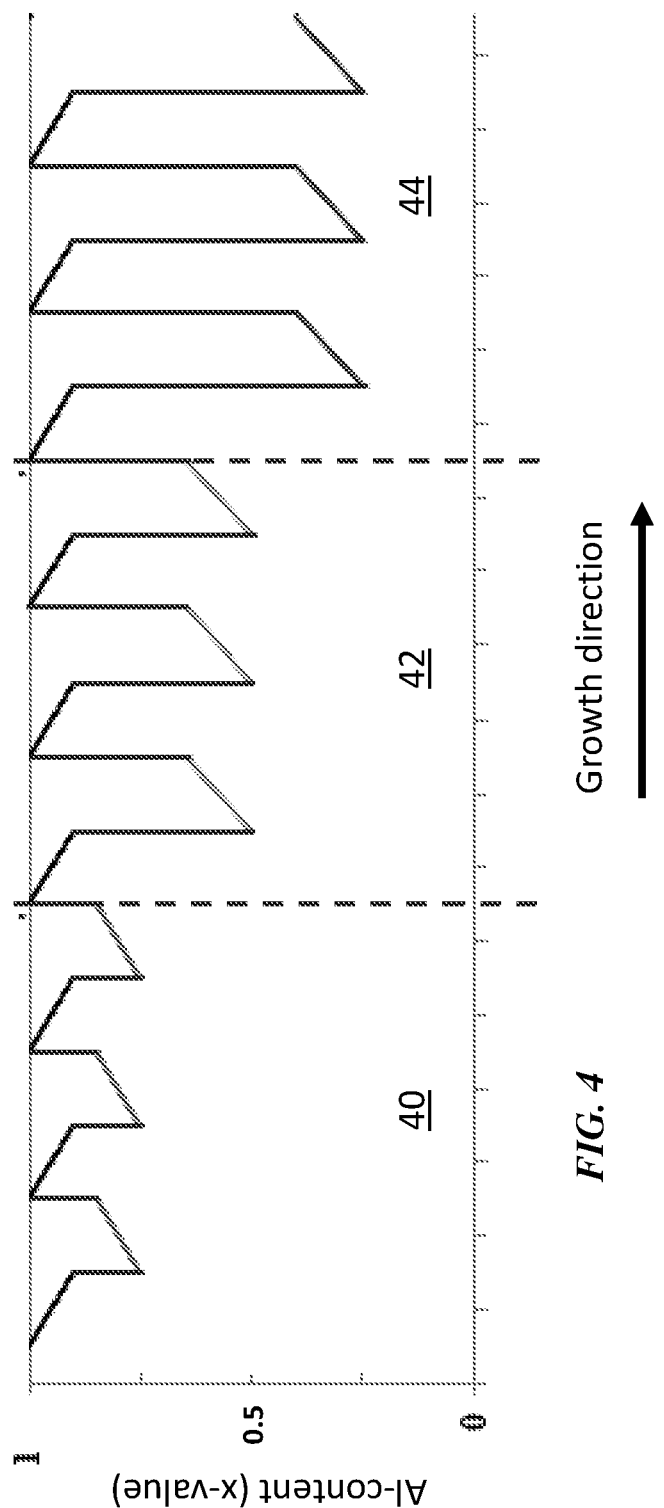
FIG. 4 depicts an embodiment of the composition of a buffer layer according to the present disclosure.

FIG. 4 depicts an embodiment of the composition of a buffer layer according to the present disclosure. As depicted, the aluminum content in a buffer layer having a formula of $Al_xIn_yGa_{1-x-y}N$, where x≤1 and y≥0, may be varied throughout the thickness of the buffer layer so that the buffer layer has a first region 40, comprising at least two layers, one having a first layer profile and another having a second layer profile, wherein the first layer profile has a higher aluminum content than the second layer profile; wherein the buffer layer has a second region 42 comprising at least two layers, one having a third layer profile and another with a fourth layer profile, wherein the third layer profile has a higher aluminum content than the fourth layer profile and the fourth layer profile has a lower aluminum content than the second layer profile of the first region; and wherein the buffer layer has a third region 44 comprising at least two layers, one having a fifth layer profile and another with a sixth layer profile, wherein the fifth layer profile has a higher aluminum content than the sixth layer profile and the sixth layer profile has a lower aluminum content than the fourth layer profile of the second region.

The aluminum content is shown as the y-axis in FIG. 4 and represents the value for "x" in the buffer layer formula of $Al_xIn_yGa_{1-x-y}N$, where x≤1 and y≥0. Further, in FIG. 4 each of the layers with an odd numbered layer profile a variable aluminum content that continuously decreases throughout their thickness in the growth direction, while each of the layers with an even numbered layer profile have a variable aluminum content that continuously increases throughout their thickness in the growth direction. FIG. 4 depicts the buffer layer in the first region 40 repeating the first layer profile and the second layer profile three times however, in one or more embodiments, a buffer layer may repeat the first layer profile and second layer profile in the first region 40 at least 5 times or at least 10 times and up to 20 times. Similarly, the buffer layer in the second region 42 is shown in FIG. 4 repeating the third layer profile and the fourth layer profile three times however, in one or more embodiments, a buffer layer may repeat the third layer profile and fourth layer profile in the second region 42 at least 5 times or at least 10 times and up to 20 times. Finally, the buffer layer in the third region 44 is shown in FIG. 4 repeating the fifth layer profile and the sixth layer profile three times however, in one or more embodiments, a buffer layer may repeat the fifth layer profile and sixth layer profile in the third region 44 at least 5 times or at least 10 times and up to 20 times.

In embodiments that have a buffer layer using a similar layer profile as what is depicted in FIG. 4 the aluminum content for the first layer profile, third layer profile, and fifth layer profile may be between 0.91 and 1, for the second layer profile it may vary between 0.7 and 0.9, for the fourth layer profile it may vary between 0.5 and 0.69, and for the sixth layer profile it may be between 0.01 and 0.49. In one or more embodiments of the present disclosure, the terminal layer of the buffer layer (i.e., the last layer deposited prior to depositing the working group III-V semiconductor layer) may have at least a portion of the layer with an aluminum content equal to or less than 0.5, or equal to or less than 0.35, or equal to or less than 0.25.

Figure 5:
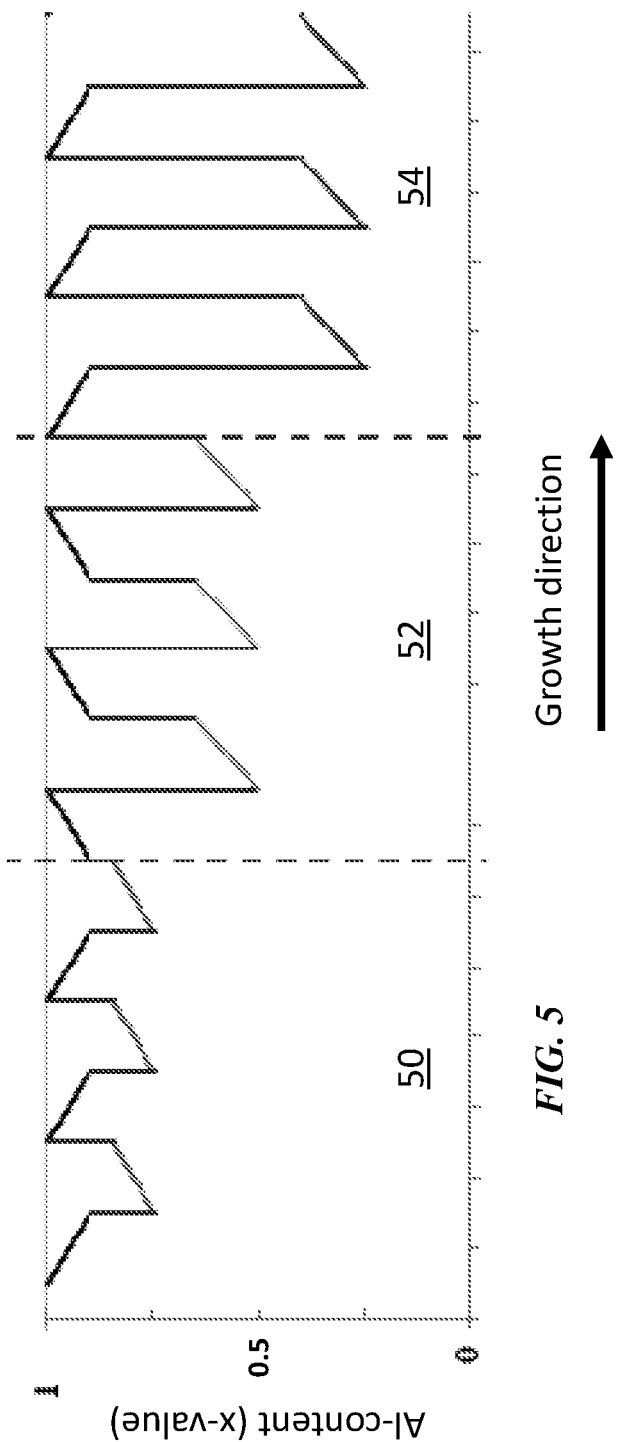
FIG. 5 depicts an embodiment of the composition of a buffer layer according to the present disclosure.

FIG. 5 depicts an embodiment of the composition of a buffer layer according to the present disclosure. As depicted, the aluminum content in a buffer layer having a formula of $Al_xIn_yGa_{1-x-y}N$, where x≤1 and y≥0, may be varied throughout the thickness of the buffer layer so that the buffer layer has a first region 50, comprising at least two layers, one having a first layer profile and another having a second layer profile, wherein the first layer profile has a higher aluminum content than the second layer profile; wherein the buffer layer has a second region 52 comprising at least two layers, one having a third layer profile and another with a fourth layer profile, wherein the third layer profile has a higher aluminum content than the fourth layer profile and the fourth layer profile has a lower aluminum content than the second layer profile of the first region; and wherein the buffer layer has a third region 54 comprising at least two layers, one having a fifth layer profile and another with a sixth layer profile, wherein the fifth layer profile has a higher aluminum content than the sixth layer profile and the sixth layer profile has a lower aluminum content than the fourth layer profile of the second region.

The aluminum content is shown as the y-axis in FIG. 5 and represents the value for "x" in the buffer layer formula of $Al_xIn_yGa_{1-x-y}N$, where x≤1 and y≥0. Further, in FIG. 5 the layers with a first layer profile and a fifth layer profile have a variable aluminum content that continuously decreases throughout their thickness in the growth direction, while the layers with a third layer profile, second layer profile, fourth layer profile, and sixth layer profile have a variable aluminum content that continuously increases throughout their thickness in the growth direction. FIG. 5 depicts the buffer layer in the first region 50 repeating the first layer profile and the second layer profile three times however, in one or more embodiments, a buffer layer may repeat the first layer profile and second layer profile in the first region 50 at least 5 times or at least 10 times and up to 20 times. Similarly, the buffer layer in the second region 52 is shown in FIG. 5 repeating the third layer profile and the fourth layer profile three times however, in one or more embodiments, a buffer layer may repeat the third layer profile and fourth layer profile in the second region 52 at least 5 times or at least 10 times and up to 20 times. Finally, the buffer layer in the third region 54 is shown in FIG. 5 repeating the fifth layer profile and the sixth layer profile three times however, in one or more embodiments, a buffer layer may repeat the fifth layer profile and sixth layer profile in the third region 54 at least 5 times or at least 10 times and up to 20 times.

In embodiments that have a buffer layer using a similar layer profile as what is depicted in FIG. 5 the aluminum content for the first layer profile, third layer profile, and fifth layer profile may be between 0.91 and 1, for the second layer profile it may vary between 0.7 and 0.9, for the fourth layer profile it may vary between 0.5 and 0.69, and for the sixth layer profile it may be between 0.01 and 0.49. In one or more embodiments of the present disclosure, the terminal layer of the buffer layer (i.e., the last layer deposited prior to depositing the working group III-V semiconductor layer) may have at least a portion of the layer with an aluminum content equal to or less than 0.5, or equal to or less than 0.35, or equal to or less than 0.25.

Figure 6:
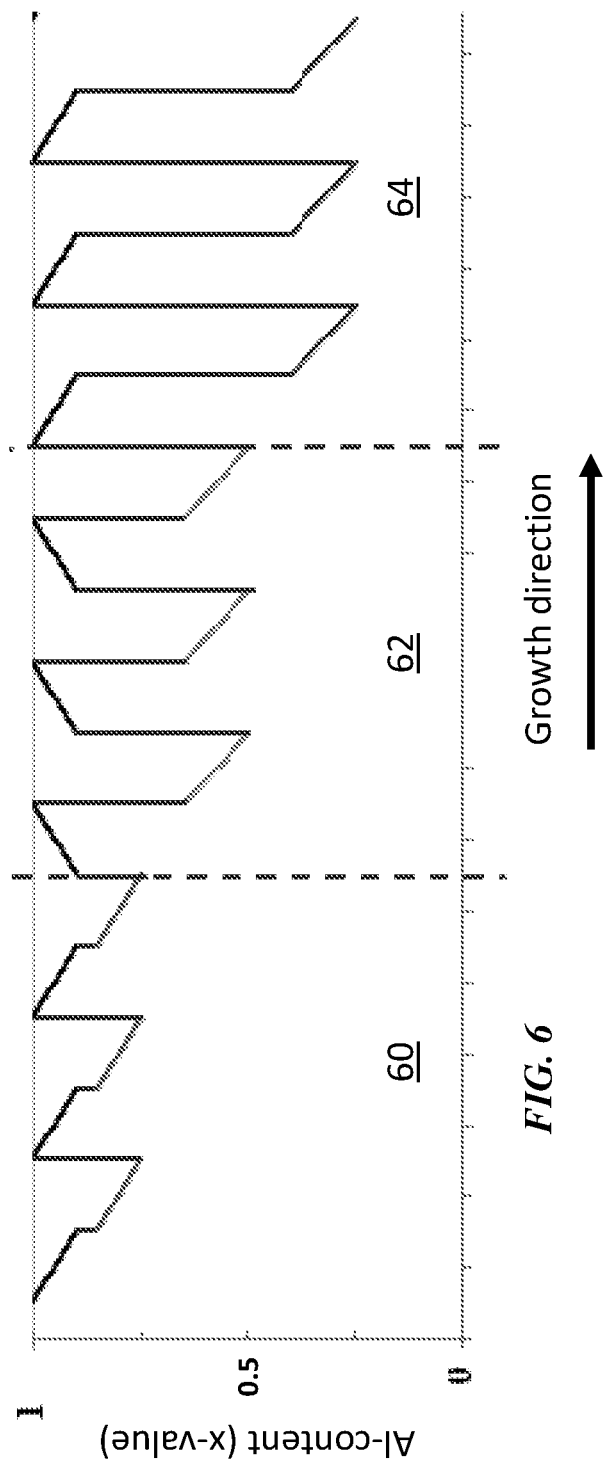
FIG. 6 depicts an embodiment of the composition of a buffer layer according to the present disclosure.

FIG. 6 depicts an embodiment of the composition of a buffer layer according to the present disclosure. As depicted, the aluminum content in a buffer layer having a formula of $Al_xIn_yGa_{1-x-y}N$, where x≤1 and y≥0, may be varied throughout the thickness of the buffer layer so that the buffer layer has a first region 60, comprising at least two layers, one having a first layer profile and another having a second layer profile, wherein the first layer profile has a higher aluminum content than the second layer profile; wherein the buffer layer has a second region 62 comprising at least two layers, one having a third layer profile and another with a fourth layer profile, wherein the third layer profile has a higher aluminum content than the fourth layer profile and the fourth layer profile has a lower aluminum content than the second layer profile of the first region; and wherein the buffer layer has a third region 64 comprising at least two layers, one having a fifth layer profile and another with a sixth layer profile, wherein the fifth layer profile has a higher aluminum content than the sixth layer profile and the sixth layer profile has a lower aluminum content than the fourth layer profile of the second region.

The aluminum content is shown as the y-axis in FIG. 6 and represents the value for "x" in the buffer layer formula of $Al_xIn_yGa_{1-x-y}N$, where x≤1 and y≥0. Further, in FIG. 6 the layers with a first layer profile, second layer profile, fourth layer profile, fifth layer profile and sixth layer profile have a variable aluminum content that continuously decreases throughout their thickness in the growth direction, while the layers with a third layer profile have a variable aluminum content that continuously increases throughout their thickness in the growth direction. FIG. 6 depicts the buffer layer in the first region 60 repeating the first layer profile and the second layer profile three times however, in one or more embodiments, a buffer layer may repeat the first layer profile and second layer profile in the first region 60 at least 5 times or at least 10 times and up to 20 times. Similarly, the buffer layer in the second region 62 is shown in FIG. 6 repeating the third layer profile and the fourth layer profile three times however, in one or more embodiments, a buffer layer may repeat the third layer profile and fourth layer profile in the second region 62 at least 5 times or at least 10 times and up to 20 times. Finally, the buffer layer in the third region 64 is shown in FIG. 6 repeating the fifth layer profile and the sixth layer profile three times however, in one or more embodiments, a buffer layer may repeat the fifth layer profile and sixth layer profile in the third region 64 at least 5 times or at least 10 times and up to 20 times.

In embodiments that have a buffer layer using a similar layer profile as what is depicted in FIG. 6 the aluminum content for the first layer profile, third layer profile, and fifth layer profile may be between 0.91 and 1, for the second layer profile it may vary between 0.7 and 0.9, for the fourth layer profile it may vary between 0.5 and 0.69, and for the sixth layer profile it may be between 0.01 and 0.49. In one or more embodiments of the present disclosure, the terminal layer of the buffer layer (i.e., the last layer deposited prior to depositing the working group III-V semiconductor layer) may have at least a portion of the layer with an aluminum content equal to or less than 0.5, or equal to or less than 0.35, or equal to or less than 0.25.

Figure 7:
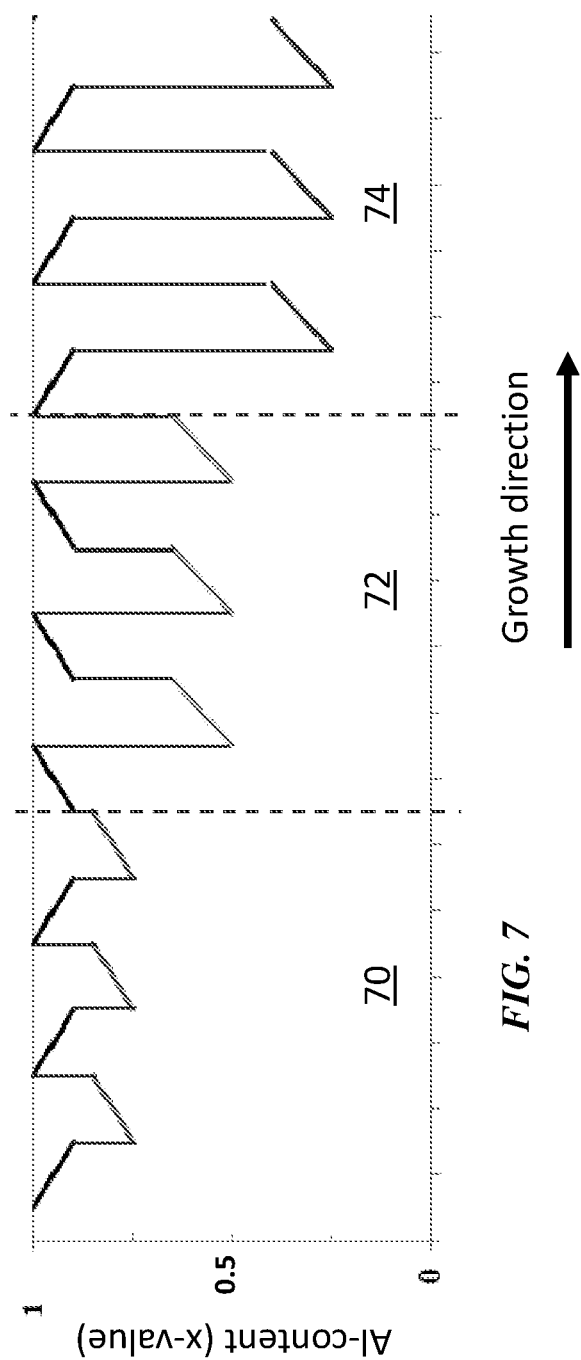
FIG. 7 depicts an embodiment of the composition of a buffer layer according to the present disclosure.

FIG. 7 depicts an embodiment of the composition of a buffer layer according to the present disclosure. As depicted, the aluminum content in a buffer layer having a formula of $Al_xIn_yGa_{1-x-y}N$, where x≤1 and y≥0, may be varied throughout the thickness of the buffer layer so that the buffer layer has a first region 70, comprising at least two layers, one having a first layer profile and another having a second layer profile, wherein the first layer profile has a higher aluminum content than the second layer profile; wherein the buffer layer has a second region 72 comprising at least two layers, one having a third layer profile and another with a fourth layer profile, wherein the third layer profile has a higher aluminum content than the fourth layer profile and the fourth layer profile has at least a portion of the layer with a lower aluminum content than the second layer profile of the first region; and wherein the buffer layer has a third region 74 comprising at least two layers, one having a fifth layer profile and another with a sixth layer profile, wherein the fifth layer profile has a higher aluminum content than the sixth layer profile and the sixth layer profile has a lower aluminum content than the fourth layer profile of the second region.

The aluminum content is shown as the y-axis in FIG. 7 and represents the value for "x" in the buffer layer formula of $Al_xIn_yGa_{1-x-y}N$, where x≤1 and y≥0. Further, in FIG. 7 the layers with a first layer profile and fifth layer profile have a variable aluminum content that continuously decreases throughout their thickness in the growth direction, while the layers with a second layer profile, third layer profile, fourth layer profile, and sixth layer profile have a variable aluminum content that continuously increases throughout their thickness in the growth direction. FIG. 7 depicts the buffer layer in the first region 70 repeating the first layer profile and the second layer profile three times however, in one or more embodiments, a buffer layer may repeat the first layer profile and second layer profile in the first region 70 at least 5 times or at least 10 times and up to 20 times. Similarly, the buffer layer in the second region 72 is shown in FIG. 7 repeating the third layer profile and the fourth layer profile three times however, in one or more embodiments, a buffer layer may repeat the third layer profile and fourth layer profile in the second region 72 at least 5 times or at least 10 times and up to 20 times. Finally, the buffer layer in the third region 74 is shown in FIG. 7 repeating the fifth layer profile and the sixth layer profile three times however, in one or more embodiments, a buffer layer may repeat the fifth layer profile and sixth layer profile in the third region 74 at least 5 times or at least 10 times and up to 20 times.

In embodiments that have a buffer layer using a similar layer profile as what is depicted in FIG. 7 the aluminum content for the first layer profile, third layer profile, and fifth layer profile may be between 0.91 and 1, for the second layer profile it may vary between 0.7 and 0.9, for the fourth layer profile it may vary between 0.5 and 0.75, and for the sixth layer profile it may be between 0.01 and 0.49. In one or more embodiments of the present disclosure, the terminal layer of the buffer layer (i.e., the last layer deposited prior to depositing the working group III-V semiconductor layer) may have at least a portion of the layer with an aluminum content equal to or less than 0.5, or equal to or less than 0.35, or equal to or less than 0.25.

Figure 8:
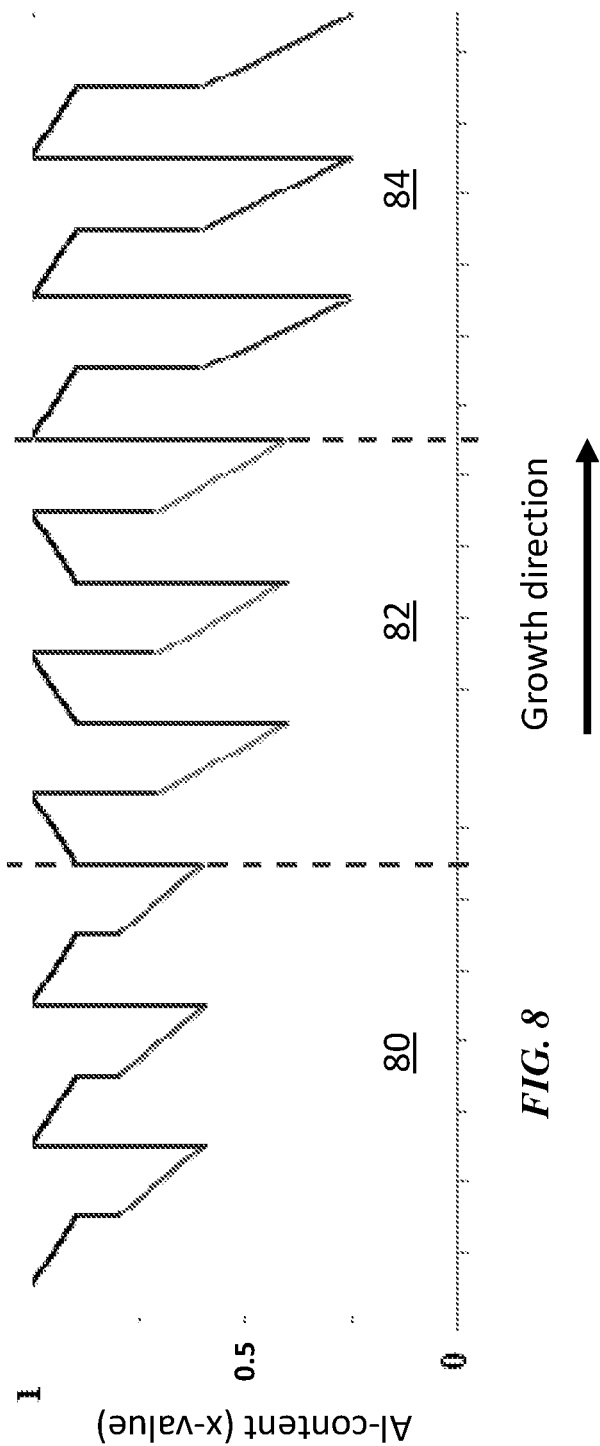
FIG. 8 depicts an embodiment of the composition of a buffer layer according to the present disclosure.

FIG. 8 depicts an embodiment of the composition of a buffer layer according to the present disclosure. As depicted, the aluminum content in a buffer layer having a formula of $Al_xIn_yGa_{1-x-y}N$, where x≤1 and y≥0, may be varied throughout the thickness of the buffer layer so that the buffer layer has a first region 80, comprising at least two layers, one having a first layer profile and another having a second layer profile, wherein the first layer profile has a higher aluminum content than the second layer profile; wherein the buffer layer has a second region 82 comprising at least two layers, one having a third layer profile and another with a fourth layer profile, wherein the third layer profile has a higher aluminum content than the fourth layer profile and the fourth layer profile has at least a portion of the layer with a lower aluminum content than the second layer profile of the first region; and wherein the buffer layer has a third region 84 comprising at least two layers, one having a fifth layer profile and another with a sixth layer profile, wherein the fifth layer profile has a higher aluminum content than the sixth layer profile and the sixth layer profile has at least a portion of the layer with a lower aluminum content than the fourth layer profile of the second region.

The aluminum content is shown as the y-axis in FIG. 8 and represents the value for "x" in the buffer layer formula of $Al_xIn_yGa_{1-x-y}N$, where x≤1 and y≥0. Further, in FIG. 8 the layers with a first layer profile, second layer profile, fourth layer profile, fifth layer profile and sixth layer profile have a variable aluminum content that continuously decreases throughout their thickness in the growth direction, while the layer with a third layer profile has a variable aluminum content that continuously increases throughout their thickness in the growth direction. FIG. 8 depicts the buffer layer in the first region 80 repeating the first layer profile and the second layer profile three times however, in one or more embodiments, a buffer layer may repeat the first layer profile and second layer profile in the first region 80 at least 5 times or at least 10 times and up to 20 times. Similarly, the buffer layer in the second region 82 is shown in FIG. 8 repeating the third layer profile and the fourth layer profile three times however, in one or more embodiments, a buffer layer may repeat the third layer profile and fourth layer profile in the second region 82 at least 5 times or at least 10 times and up to 20 times. Finally, the buffer layer in the third region 84 is shown in FIG. 8 repeating the fifth layer profile and the sixth layer profile three times however, in one or more embodiments, a buffer layer may repeat the fifth layer profile and sixth layer profile in the third region 84 at least 5 times or at least 10 times and up to 20 times.

In embodiments that have a buffer layer using a similar layer profile as what is depicted in FIG. 8 the aluminum content for the first layer profile, third layer profile, and fifth layer profile may be between 0.91 and 1, for the second layer profile it may vary between 0.7 and 0.9, for the fourth layer profile it may vary between 0.45 and 0.75, and for the sixth layer profile it may be between 0.01 and 0.55. In one or more embodiments of the present disclosure, the terminal layer of the buffer layer (i.e., the last layer deposited prior to depositing the working group III-V semiconductor layer) may have at least a portion of the layer with an aluminum content equal to or less than 0.5, or equal to or less than 0.35, or equal to or less than 0.25.

Figure 9:
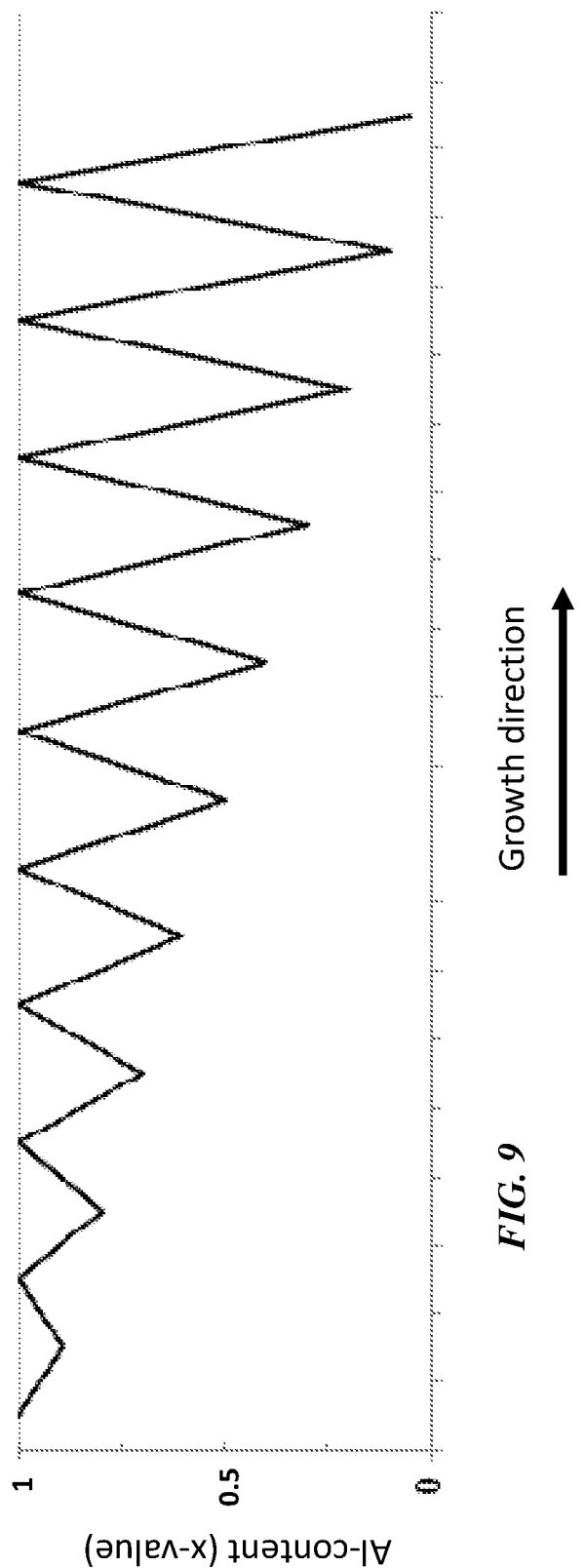
FIG. 9 depicts an embodiment of the composition of a buffer layer according to the present disclosure.

FIG. 9 depicts an embodiment of the composition of a buffer layer according to the present disclosure. As depicted, the aluminum content in a buffer layer having a formula of $Al_xIn_yGa_{1-x-y}N$, where $x≤1$ and $y≥0$, may be varied throughout the thickness of the buffer layer and wherein the content of aluminum continuously varies throughout the thickness of the buffer layer and includes repeating layers of continuously increasing aluminum content and layers of continuously decreasing aluminum content, along the growth direction of the buffer layer. In particular, in the embodiment shown in FIG. 9 the layers of increasing aluminum content all terminate in substantially the same aluminum content, which may range from about 0.9 to 1. The layers of decreasing aluminum content terminate in an aluminum content that is lower than the previously deposited layer of decreasing aluminum content. In one or more embodiments, the layers of decreasing aluminum content may include an aluminum content between about 1 and 0.01.

Figure 10:
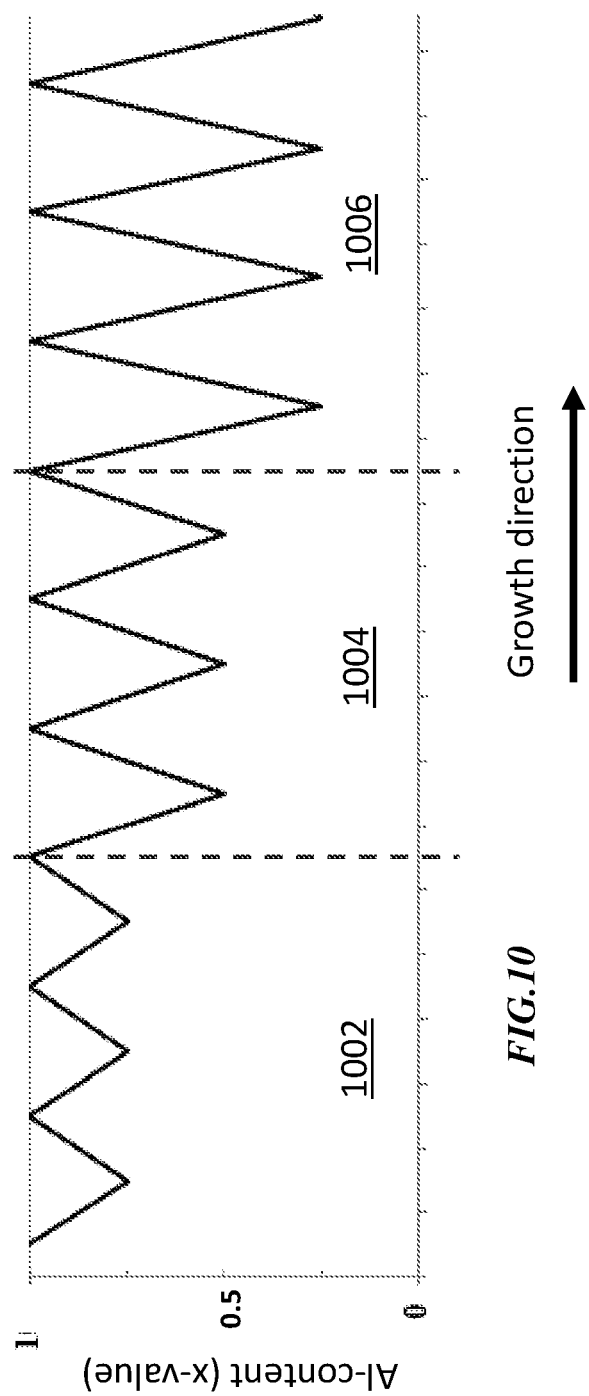
FIG. 10 depicts an embodiment of the composition of a buffer layer according to the present disclosure.

FIG. 10 depicts an embodiment of the composition of a buffer layer according to the present disclosure. As depicted, the aluminum content in a buffer layer having a formula of $Al_xIn_yGa_{1-x-y}N$, where $x≤1$ and $y≥0$, may be varied throughout the thickness of the buffer layer and wherein the content of aluminum continuously varies throughout the thickness of the buffer layer and includes repeating layers of continuously increasing aluminum content and layers of continuously decreasing aluminum content, along the growth direction of the buffer layer. In particular, in the embodiment shown in FIG. 10 the layers of increasing aluminum content all terminate at the same aluminum content, which may range from about 0.9 to 1. FIG. 10 also shows a buffer layer having a first region 1002, a second region 1004, and a third region 1006. The layers of decreasing aluminum content in the first region 1002 terminate in substantially the same aluminum content, the layers of decreasing aluminum content in the second region 1004 terminate in substantially the same aluminum content, and the layers of decreasing aluminum content in the third region 1006 terminate in substantially the same aluminum content. Further, the layers of decreasing aluminum content in the third region 1006 terminate in a lower aluminum content than the termination point of the layers of decreasing aluminum content in the first region 1002 and second region 1004. Additionally, the layers of decreasing aluminum content in the second region 1004 terminate in a lower aluminum content than the first region 1002. In one or more embodiments, the layers of decreasing aluminum content in the first region 1002 may include an aluminum content between about 1 and 0.75 and the layers of decreasing aluminum content in the second region 1004 may include an aluminum content between about 1 and 0.5, and the layers of decreasing aluminum content in the third region 1006 may include an aluminum content between about 1 and 0.01. Embodiments, that have a similar repeat structure as depicted in FIG. 10 (i.e., cycling between continuously decreasing and continuously increasing aluminum content) may repeat at least 5 times or at least 10 times and up to 20 times within any particular single region. However, the terminal layer profile in the buffer layer should terminate at an aluminum content equal to or less than 0.5, or equal to or less than 0.35, or equal to or less than 0.25.

Figure 11:
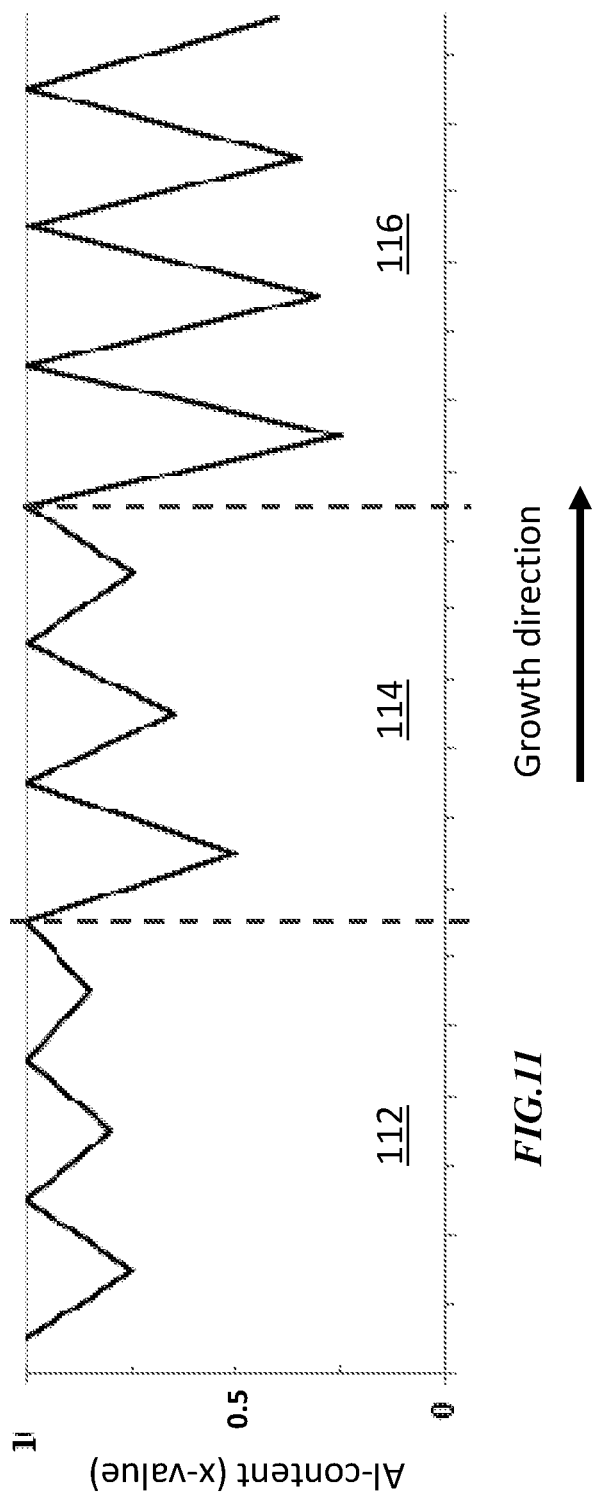
FIG. 11 depicts an embodiment of the composition of a buffer layer according to the present disclosure.

FIG. 11 depicts an embodiment of the composition of a buffer layer according to the present disclosure. As depicted, the aluminum content in a buffer layer having a formula of $Al_xIn_yGa_{1-x-y}N$, where $x≤1$ and $y≥0$, may be varied throughout the thickness of the buffer layer and wherein the content of aluminum continuously varies throughout the thickness of the buffer layer and includes repeating layers of continuously increasing aluminum content and layers of continuously decreasing aluminum content, along the growth direction of the buffer layer. In particular, in the embodiment shown in FIG. 11 the layers of increasing aluminum content all terminate at the same aluminum content, which may range from about 0.9 to 1. FIG. 11 also shows a buffer layer having a first region 112, a second region 114, and a third region 116. The layers of decreasing aluminum content in the first region 112 terminate in a progressively higher aluminum content than the initial decreasing layer when progressing in the growth direction, the layers of decreasing aluminum content in the second region 114 terminate in a higher aluminum content than the prior decreasing layer when progressing in the growth direction, and the layers of decreasing aluminum content in the third region 116 terminate in a higher aluminum content than the prior decreasing layer when progressing in the growth direction. Further, the layers of decreasing aluminum content in the third region 116 terminate in the lower aluminum content than the termination points of the layers of decreasing aluminum content in the first region 112 and second region 114. Additionally, the layers of decreasing aluminum content in the second region 114 terminate in the lower aluminum content, or substantially the same aluminum content, than the first region 112. In one or more embodiments, the layers of decreasing aluminum content in the first region 112 may include an aluminum content between about 1 and 0.75 and the layers of decreasing aluminum content in the second region 114 may include an aluminum content between about 1 and 0.5, and the layers of decreasing aluminum content in the third region 116 may include an aluminum content between about 1 and 0.01. Embodiments, that have a similar repeat structure as depicted in FIG. 11 (i.e., cycling between continuously decreasing and continuously increasing aluminum content) may repeat at least 5 times or at least 10 times and up to 20 times within any particular single region. However, the terminal layer profile in the buffer layer should terminate at an aluminum content equal to or less than 0.5, or equal to or less than 0.35, or equal to or less than 0.25.

Figure 12:
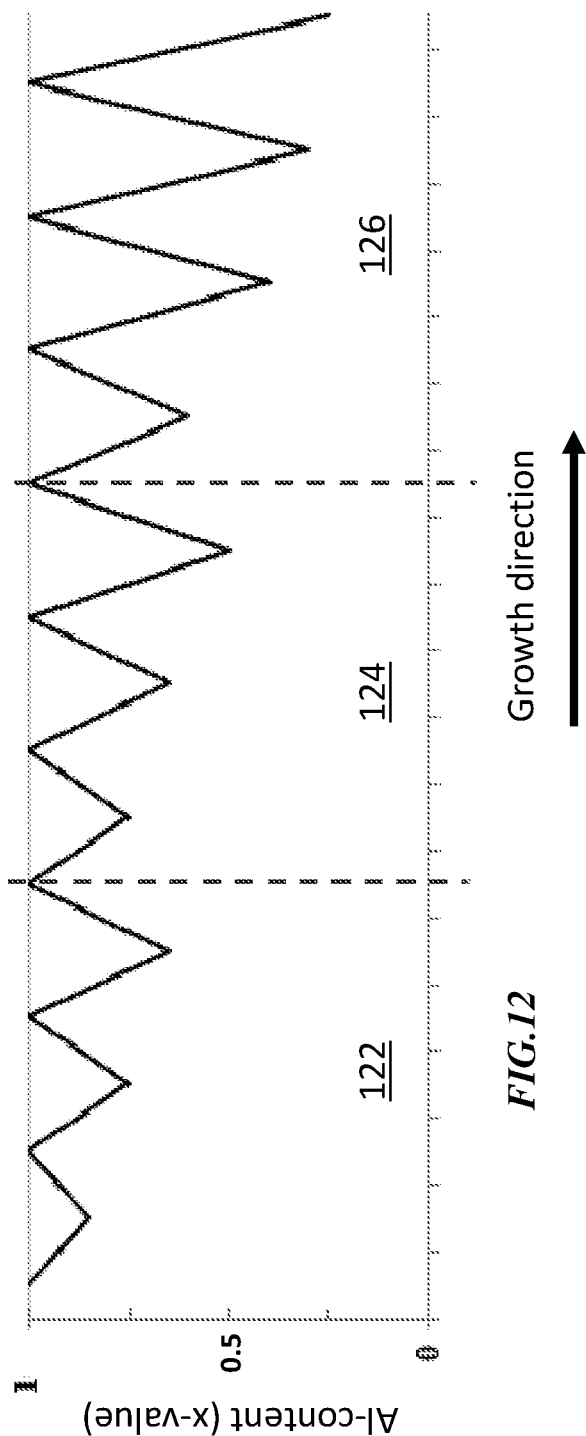
FIG. 12 depicts an embodiment of the composition of a buffer layer according to the present disclosure.

FIG. 12 depicts an embodiment of the composition of a buffer layer according to the present disclosure. As depicted, the aluminum content in a buffer layer having a formula of $Al_xIn_yGa_{1-x-y}N$, where $x≤1$ and $y≥0$, may be varied throughout the thickness of the buffer layer and wherein the content of aluminum continuously varies throughout the thickness of the buffer layer and includes repeating layers of continuously increasing aluminum content and layers of continuously decreasing aluminum content, along the growth direction of the buffer layer. In particular, in the embodiment shown in FIG. 12 the layers of increasing aluminum content all terminate at the same aluminum content, which may range from about 0.9 to 1. FIG. 12 also shows a buffer layer having a first region 122, a second region 124, and a third region 126. The layers of decreasing aluminum content in the first region 122 terminate in a progressively lower aluminum content than the prior decreasing layer when progressing in the growth direction, the layers of decreasing aluminum content in the second region 124 terminate in a progressively lower aluminum content than the prior decreasing layer when progressing in the growth direction, and the layers of decreasing aluminum content in the third region 126 terminate in a progressively lower aluminum content than the prior decreasing layer when progressing in the growth direction. Further, the layers of decreasing aluminum content in the third region 126, with exception of the initial decreasing layer, terminate in a lower aluminum content than the termination points of the layers of decreasing aluminum content in the first region 122 and second region 124. Additionally, the layers of decreasing aluminum content in the second region 124, with the exception of the initial decreasing layer, terminate in a lower aluminum content, or substantially the same aluminum content, than the first region 122. In one or more embodiments, the layers of decreasing aluminum content in the first region 122 may include an aluminum content between about 1 and 0.75 and the layers of decreasing aluminum content in the second region 114 may include an aluminum content between about 1 and 0.5, and the layers of decreasing aluminum content in the third region 116 may include an aluminum content between about 1 and 0.01. Embodiments, that have a similar repeat structure as depicted in FIG. 12 (i.e., cycling between continuously decreasing and continuously increasing aluminum content) may repeat at least 5 times or at least 10 times and up to 20 times within any particular single region. However, the terminal layer profile in the buffer layer should terminate at an aluminum content equal to or less than 0.5, or equal to or less than 0.35, or equal to or less than 0.25.

In general, the layers of the buffer layer, and the group III-V working layer, may be deposited by epitaxially on the substrate using ammonia ($NH_3$) as the nitrogen source, trimethylaluminium (TMAl) or triethylaluminium (TEAl) as the aluminum source, trimethylgallium (TMGa) or triethylgallium (TEGa) as the gallium source, and trimethylindium (TMIn) as the indium source. These reactants may be reacted in the gas phase and their relative ratios are modulated during the reaction in order to produce buffer layers that have the desired layer profile. For example, for a layer that has a constant composition the ratio of reactants may remain substantially the same throughout the reaction/deposition of the layer, while a layer that has a continuously increasing aluminum content may have the reactants modulated during the reaction/deposition so that the aluminum content is continuously increasing. Further aspects of the deposition process that may be modulated to affect the composition of the layers deposited may include the growth rate, pressure, and/or the growth temperature during the buffer layer's fabrication. In one or more embodiments, only one of the factors discussed above may be manipulated to modulate/adjust the aluminum content during the growth of the buffer layer or, in other embodiments, two or more of these factors may be manipulated to modulate/adjust the aluminum content.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A heterostructure, comprising:
a substrate; and
a buffer layer comprising a plurality of layers having a composition $Al_xIn_yGa_{1-x-y}N$, where x≤1 and y≥0;
wherein the buffer layer has a first region, comprising at least two layers, one according to a first layer profile and another according to a second layer profile, wherein the first layer profile has a higher aluminum content than the second layer profile;
wherein the buffer layer has a second region comprising at least two layers, one according to a third layer profile and another according to a fourth layer profile, wherein the third layer profile has a higher aluminum content than the fourth layer profile and the fourth layer profile at any point along a growth direction has a lower aluminum content than the second layer profile of the first region at any point along the growth direction;
wherein the buffer layer has a third region comprising at least two layers, one according to a fifth layer profile and another according to a sixth layer profile, wherein the fifth layer profile has a higher aluminum content than the sixth layer profile and the sixth layer profile at any point along the growth direction has a lower aluminum content than the fourth layer profile of the second region at any point along the growth direction; and
wherein the aluminum content varies continuously throughout a thickness of the even numbered layer profiles.

2. The heterostructure of claim 1, wherein the aluminum content varies continuously throughout a thickness of each individual layer.

3. The heterostructure of claim 1, wherein the aluminum content varies continuously between the same content values throughout a thickness of the odd numbered layer profiles.

4. The heterostructure of claim 1, wherein at least one pair of layer profiles selected from the first layer profile and second layer profile, third layer profile and fourth layer profile, and fifth layer profile and sixth layer profile repeats at least one time within the first region, second region, or third region, respectively.

5. The heterostructure of claim 1, wherein the buffer layer has a thickness, measured in the growth direction, of at least 1 micrometer.

6. The heterostructure of claim 1, wherein each individual layer independently has a thickness, measured in the growth direction, between about 1 nanometer and 50 nanometers.

7. The heterostructure of claim 1, wherein the thickness of the layers with odd numbered layer profiles is substantially the same and/or the thickness of the layers with even numbered layer profiles is substantially the same.

8. The heterostructure of claim 7, wherein the thickness of the layers with odd numbered layer profiles is different from the thickness of layers with even numbered layer profiles.

9. A heterostructure, comprising:
a substrate;
a buffer layer having a composition $Al_xIn_yGa_{1-x-y}N$, where x≤1 and y≥0;
a plurality of layers; and
a first region comprising at least two layers, one with a first layer profile and another with a second layer profile, wherein the first layer profile has a continuously decreasing aluminum concentration and the second layer profile has a continuously increasing aluminum concentration;
a second region comprising at least two layers, one with a third layer profile and another with a fourth layer profile, wherein the third layer profile has a continuously decreasing aluminum concentration and the fourth layer profile has a continuously increasing aluminum concentration;
a third region comprising at least two layers, one with a fifth layer profile and another with a sixth layer profile, wherein the fifth layer profile has a continuously decreasing aluminum concentration and the sixth layer profile has a continuously increasing aluminum concentration; and
wherein the first layer profile terminates at an aluminum content that is higher than the aluminum content at the termination of the third layer profile.

10. The heterostructure of claim 9, wherein the buffer layer has a plurality of layers and along a growth direction with the plurality of layers repeatedly changing from a layer of continuously increasing aluminum concentration to a layer of continuously decreasing aluminum concentration, or vice versa, and wherein each successive layer of continuously decreasing aluminum concentration in the growth direction terminates at a lower aluminum concentration than the previous layer of continuously decreasing aluminum concentration.

11. The heterostructure of claim 9, wherein at least one pair of layer profiles selected from the first layer profile and second layer profile, third layer profile and fourth layer profile, and fifth layer profile and sixth layer profile repeats at least one time within the first region, second region, or third region, respectively.

12. The heterostructure of claim 9, wherein the third layer profile terminates at an aluminum content that is higher than the aluminum content at the termination of the fifth layer profile.

13. The heterostructure of claim 11, wherein along the growth direction of at least one of the first region, second region, or third region, respectively, each successive layer with continuously decreasing aluminum content terminates at a higher aluminum content; and
 wherein the aluminum content at the termination of an initial layer having a third layer profile of the second region is lower than the aluminum content at the termination of the initial layer having a first layer profile of the first region; and
 wherein the aluminum content at the termination of an initial layer having a fifth layer profile of the third region is lower than the aluminum content at the termination of the initial layer having a third layer profile of the second region.

14. The heterostructure of claim 11, wherein along the growth direction of at least one of the first region, second region, or third region, respectively, each successive layer with continuously decreasing aluminum content terminates at a lower aluminum content; and
 wherein the aluminum content at the termination of an initial layer having a third layer profile of the second region is lower than the aluminum content at the termination of the initial layer having a first layer profile of the first region but higher than the aluminum content at the termination of a terminally grown layer with continuously decreasing aluminum content of the first region; and
 wherein the aluminum content at the termination of an initial layer having a fifth layer profile of the third region is lower than the aluminum content at the termination of the initial layer having a third layer profile of the second region but higher than the aluminum content at the termination of a terminally grown layer with continuously decreasing aluminum content of the second region.

* * * * *